United States Patent
Khajehnouri et al.

[11] Patent Number: 6,117,786
[45] Date of Patent: Sep. 12, 2000

[54] METHOD FOR ETCHING SILICON DIOXIDE USING FLUOROCARBON GAS CHEMISTRY

[75] Inventors: Keyvan Khajehnouri, San Jose; Thomas D. Nguyen, Campbell; George Mueller, San Jose, all of Calif.

[73] Assignee: Lam Research Corporation, Fremont, Calif.

[21] Appl. No.: 09/071,960

[22] Filed: May 5, 1998

[51] Int. Cl.[7] .......................... C03C 15/00; C03C 25/00; H01B 13/00; H01L 21/302

[52] U.S. Cl. .......................... 438/700; 438/723; 216/17; 216/67; 216/79

[58] Field of Search .................................. 216/63, 67, 74, 216/79, 13, 17, 18; 438/700, 723, 724, 743

[56] References Cited

U.S. PATENT DOCUMENTS

| | | | |
|---|---|---|---|
| 5,013,398 | 5/1991 | Long et al. | 156/643 |
| 5,013,400 | 5/1991 | Kurasaki et al. | 156/643 |
| 5,021,121 | 6/1991 | Groechel et al. | 156/643 |
| 5,022,958 | 6/1991 | Favreau et al. | 156/643 |
| 5,254,213 | 10/1993 | Tamaki | 156/655 |
| 5,269,879 | 12/1993 | Rhoades et al. | 156/643 |
| 5,431,778 | 7/1995 | Dahm et al. | 156/662.1 |
| 5,462,896 | 10/1995 | Komura et al. | 437/228 |
| 5,529,657 | 6/1996 | Ishii | 156/345 |
| 5,595,627 | 1/1997 | Inazawa et al. | 156/643.1 |
| 5,611,888 | 3/1997 | Bosch et al. | 156/643.1 |
| 5,736,457 | 4/1998 | Zhao | 438/624 |
| 5,780,338 | 7/1998 | Jeng et al. | 438/253 |

FOREIGN PATENT DOCUMENTS 0 805 485  11/1997  European Pat. Off. .

OTHER PUBLICATIONS

Norstrom, H., et al., "RIE of SiO/sub 2/ in doped and undoped fluorocarbon plasmas", Database accession No. 2033212, vol. 32, No. 12, Dec. 1982, pp. 737–745, XP002110457.

*Primary Examiner*—Jeffrie R Lund
*Assistant Examiner*—Alva C Powell
*Attorney, Agent, or Firm*—Burns, Doane, Swecker & Mathis, L.L.P.

[57] ABSTRACT

A semiconductor manufacturing process wherein deep and narrow 0.6 micron and smaller openings are plasma etched in doped and undoped silicon oxide. The etching gas includes fluorocarbon, oxygen and nitrogen reactants which cooperate to etch the silicon oxide while providing enough polymer build-up to obtain anisotropically etched openings and avoid etch stop of etched openings having aspect ratios of 5:1 and higher. The process is useful for etching 0.25 micron and smaller contact or via openings and can be carried out in a parallel plate plasma reactor having a showerhead electrode.

19 Claims, 3 Drawing Sheets

METHOD FOR ETCHING SILICON DIOXIDE USING FLUOROCARBON GAS CHEMISTRY

FIELD OF THE INVENTION

The present invention relates to an improved method for etching silicon oxide in the fabrication of integrated circuits.

BACKGROUND OF THE INVENTION

A common requirement in integrated circuit fabrication is the etching of openings such as contacts and vias in doped or undoped silicon oxide. Such silicon oxides include pure silicon dioxide and glasses thereof such as silicates doped with boron, phosphorus and/or arsenic. The silicon oxide can overlie a conductive or semiconductive layer such as polycrystalline silicon, metals such as aluminum, titanium, tungsten, molybdenum or alloys thereof, nitrides such as titanium nitride, metal suicides such as titanium silicide, cobalt silicide, tungsten silicide, molydenum silicide, etc.

Various plasma etching techniques for etching openings in silicon oxide are disclosed in U.S. Pat. Nos. 5,013,398; 5,013,400; 5,021,121; 5,022,958; 5,269,879; 5,529,657; 5,595,627 and 5,611,888. The plasma etching can be carried out in medium density reactors such as the parallel plate plasma reactor chambers described in the '398 patent or the triode type reactors described in the '400 patent or in high density reactors such as the inductive coupled reactors described in the '657 patent. Etching gas chemistries include the oxygen-free, Ar, $CHF_3$ and optional $CF_4$ gas mixture described in the '121 and '958 patents, the oxygen-free, fluorine-containing and nitrogen gas mixture described in the '879 patent, the $CF_4$ and CO gas mixture described in the '627 patent, the oxygen and $CF_4$ gas mixture described in the '400 patent, the oxygen, $CF_4$ and $CH_4$ gas mixture described in the '657 patent, and the Freon and neon gas mixture described in the '888 patent.

As device geometries become smaller and smaller, it is becoming necessary to plasma etch deep and narrow openings in silicon oxide. Accordingly, there is a need in the art for a plasma etching technique which achieves such deep and narrow openings. Further, it would be highly desirable to achieve such opening geometries without bowing of the sidewalls of the openings.

SUMMARY OF THE INVENTION

The invention provides a process for etching a layer of silicon oxide, comprising the steps of introducing a semiconductor substrate into a plasma etching reactor, the semiconductor substrate comprising an electrically conductive or semiconductive layer underlying a layer of silicon oxide, and etching the layer of silicon oxide to expose the electrically conductive or semiconductive layer and provide an opening extending through the layer of silicon oxide to the electrical conductive or semiconductive layer, the etching being performed by exposing the layer of silicon oxide to an etching gas in an ionized state in the plasma etching reactor, the etching gas including fluorocarbon, nitrogen and oxygen reactants and an inert carrier gas, the oxygen and nitrogen being present in amounts effective to prevent polymer build-up from causing etch stop in the openings during the etching step.

According to one aspect of the invention, the layer of silicon oxide can comprise doped or undoped silicon dioxide and the etching step can be carried out in a medium density plasma reactor. According to another aspect of the invention, the openings can be etched without bowing and have an aspect ratio of at least 5:1. The etching gas preferably consists essentially of $C_4F_8$, argon, nitrogen and oxygen. The electrically conductive or semiconductive layer can comprise a metal-containing layer selected from the group consisting of Al, Al alloys, Cu, Cu alloys, Ti, Ti alloys, doped or undoped polycrystalline or single crystal silicon, TiN, TiW, Mo, silicides of Ti, W, Co and/or Mo, etc.

The process of the invention can etch openings which are 0.6, especially 0.25 micron or smaller sized openings using a fluorocarbon gas which comprises a hydrogen-free $C_nF_m$ wherein n is at least 2 and m is greater than n, for example $C_2F_6$, $C_3F_6$, $C_4F_8$ and mixtures thereof. The carrier gas can be selected from the group consisting of Ar, He, Ne, Kr, Xe or mixtures thereof. When etching in a medium density parallel plate plasma reactor, the oxygen can be supplied to the plasma reactor at a flow rate of 3 to 15 sccm, the nitrogen can be supplied to the plasma reactor at a flow rate of 1 to 100 sccm, and the fluorocarbon gas can be supplied to the plasma reactor at a flow rate of 3 to 15 sccm. As an example, the fluorocarbon, oxygen and nitrogen gases can be supplied to the plasma reactor at flow rates of 5 to 10 sccm, 5 to 10 sccm and 20 to 60 sccm, respectively. The etching step can be carried out until up to 200% overetching is achieved and the openings can then be filled with metal. The method of the invention can also include steps of forming a photoresist layer on the layer of silicon oxide, patterning the photoresist layer to form a plurality of openings and the etching step forms via or contact openings in the silicon oxide. With the process, openings can be formed with an aspect ratio of at least 5:1. In the process, the oxygen can react with polymer deposited within the openings so as to form CO and the nitrogen can react with polymer deposited in the openings so as to form CN. The plasma reactor can be at a pressure of less than 200 mTorr during the etching step.

The process of the invention thus provides a semiconductor manufacturing process wherein deep and narrow quarter micron and smaller openings can be plasma etched in doped and undoped silicon oxide. The plasma gas chemistry includes fluorocarbon, oxygen and nitrogen gases which cooperate to etch the silicon oxide while providing enough polymer build-up to obtain anisotropically etched openings and avoid etch stop of etched openings having aspect ratios of 5:1 and higher. The process can be carried out in a parallel plate plasma reactor having a showerhead electrode.

DETAILED DESCRIPTION OF THE INVENTION

Figure 1A:
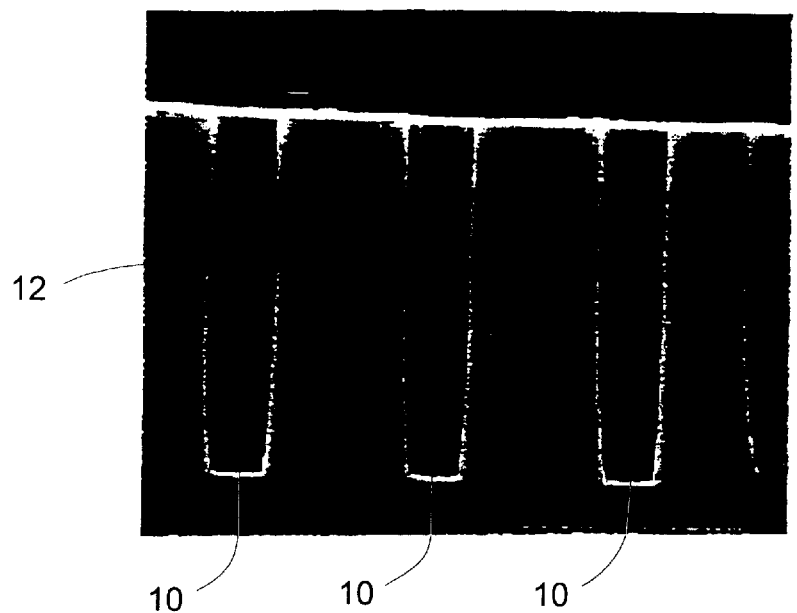
FIGS. 1a and b show profiles of contact openings formed in silicon dioxide at center and edge locations, respectively, on a silicon wafer using a plasma gas chemistry in accordance with the invention.
Figure 1B:
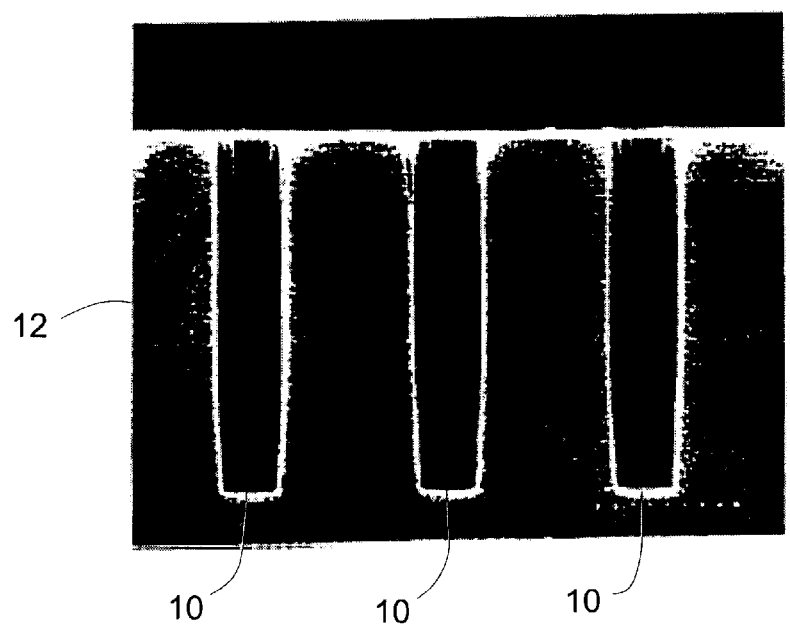

The invention provides a process for plasma etching 0.6, espacially 0.3 μm and smaller high aspect ratio features such as vias and contacts in silicon oxide layers on semiconductor substrates. In the process, a gas mixture containing fluorocarbon, oxygen and nitrogen reactants is energized into a plasma state and during the etching process the nitrogen and oxygen synergistically react to prevent polymer build-up from causing a phenomenon known as "etch stop." Etch stop is a problem which occurs during plasma etching of deep and narrow openings in silicon oxide using gas chemistries which form too much polymer, i.e., polymer-build-up in the opening prevents further etching of the silicon oxide. In the process of the invention, the polymer build-up can be reduced by the synergistic effect of breaking up the polymer with the oxygen and nitrogen in the etching gas mixture.

According to the invention, oxygen and nitrogen are added in amounts effective to control the profile of the etched opening. For instance, by increasing the amount of oxygen to a desired level it is possible to form straight openings. On the other hand, by decreasing or eliminating oxygen in the etching gas mixture it is possible to form tapered openings. As an example, a tapered opening varying in size from 0.3 μm at the top to 0.1 μm at the bottom can be formed using an oxygen-free etching gas mixture of $C_4F_8$, Ar and $N_2$. For straight openings, the preferred amount of oxygen is 50 to 75%, more preferably 60 to 70% of the amount of fluorocarbon gas. However, it is advantageous if the amount of oxygen is higher for more complex fluorocarbons such as $C_4F_8$ than for less complex fluorocarbons such as $C_3F_6$.

The oxygen can be supplied to the plasma etching reactor in amounts effective to cut through polymer at the bottom of the etched opening. For a reactor which forms a medium density plasma, oxygen can be supplied to the reactor at a flow rate of 3 to 15 sccm.

In order to obtain openings with straight sidewalls it is desirable to control the oxygen addition such that enough polymer is present to avoid or minimize bowing and enough polymer is removed to avoid the etch stop phenomenon. With respect to polymer removal, oxygen is much more effective than nitrogen. For instance, 1 sccm $O_2$ is about as effective in polymer removal as 15 sccm $N_2$. Accordingly, by selectively adjusting the $O_2$ and $N_2$ flow rates it is possible to obtain straight and narrow high aspect ratio openings.

The etching gas mixture preferably includes an inert carrier gas. Argon is an especially useful inert carrier gas which aids fluorine in attacking the silicon oxide. However, other inert gases such as He, Ne, Kr and/or Xe can be used as the carrier gas. In order to maintain pressure in the plasma etching reactor as low as possible, the amount of carrier gas introduced into the reactor should be as low as possible. For instance, for a medium density plasma reactor, argon can be supplied into the reactor in amounts of 150 to 300 sccm. The carrier gas preferably aids the oxide etching rate due to sputtering of the oxide.

The fluorocarbon preferably comprises $C_nF_m$ wherein n is at least 2 and m is greater than n, e.g. $C_4F_8$ or $C_3F_6$. Although hydrogen containing fluorocarbons are quite polymerizing, in order to avoid the etch step phenomenon, it is desirable to use hydrogen-free fluorocarbon gases so that the degree of polymerizing can be controlled to achieve deep and narrow openings through the use of a synergistic combination of nitrogen and oxygen. The amount of fluorocarbon gas to be supplied to the plasma reactor should be sufficient to achieve the desired degree of polymerizing. As an example, in a medium density plasma reactor, the fluorocarbon gas can be supplied in amounts of 3 to 15 sccm, preferably 5 to 15 sccm, and more preferably 6–7 sccm.

Nitrogen is effective in polymer removal but is less effective than oxygen. Further, whereas oxygen removes polymer by forming CO, N produces CN (cyanide gas). Because polymer removal is less sensitive to nitrogen, it is possible to selectively adjust an etching process to achieve straight and narrow openings by changing the nitrogen flow rate. For instance, if a particular oxygen flow rate results in etch stop for the size opening under consideration, nitrogen can be added until the etch stop problem is overcome. For medium density plasma reactors, nitrogen can be supplied in amounts of 0 to 100 sccm. As an example, for 0.25 μm contact openings the nitrogen flow rate can range from 20 to 60 sccm when oxygen is supplied at 4 to 7 sccm, argon is supplied at 150 to 160 sccm and $C_4F_8$ is supplied at 5 to 8 sccm.

The process of the invention is useful for obtaining extremely high aspect ratios of at least 5:1, the process being especially useful for obtaining aspect ratios up to 10:1 for openings smaller than 0.3 μm. For example, it is possible to obtain straight walls for 0.25 μm openings at depths greater than 2.1 μm.

The reactor pressure is preferably maintained as low as possible. In general, too low a reactor pressure can lead to plasma extinguishment whereas too high a reactor pressure can lead to the etch stop problem. For medium density plasma reactors, the reactor is preferably at a pressure below 200 mTorr such as 20 to 40 mTorr. Due to plasma confinement at the semiconductor substrate undergoing etching, the pressure at the substrate surface may range from 30 to 100 mTorr, e.g., 45 to 65 mTorr.

The substrate support supporting the semiconductor substrate undergoing etching preferably cools the substrate enough to prevent burning of any photoresist on the substrate, e.g., maintain the substrate below 140° C. In medium density plasma reactors, it is sufficient to cool the substrate support to a temperature of −10 to 40° C. In a dual plate plasma reactor or triode type reactor, the substrate support can comprise a bottom electrode such as an ESC on which a substrate such as a silicon wafer is electrostatically clamped and cooled by supplying helium at a desired pressure between the wafer and top surface of the ESC. In order to maintain the wafer at a desired temperature of, for example, 60 to 120° C., the He can be maintained at a pressure of 10 to 30 Torr in the space between the wafer and the chuck.

The plasma reactor preferably comprises a medium density parallel plate or triode type plasma reactor. In such reactors, it is desirable to maintain the gap between the top electrode and the bottom electrode supporting the semiconductor substrate at a distance of about 1.3 to 2.5 cm. The total power supplied to the top and bottom electrodes can be in the range of about 1000 to 4000 watts. A suitable reactor is the LAM 4520XL reactor wherein the top electrode is a silicon showerhead electrode driven at 27 MHz and the bottom electrode is an electrostatic chuck driven at 2 MHz.

The silicon oxide can be formed in a variety of ways and can include dopants such as F, B, P, As, etc. For example, the silicon oxide can be undoped silicate glass (USG), boron phosphorus silicate glass (BPSG), phosphorus silicate glass (PSG), spin on glass (SOG), doped or undoped TEOS, fluorinated silicon oxide (SiOF), thermal oxide, or other form of silicon oxide.

The process of the invention is especially well suited for etching deep and narrow openings through silicon oxide to an underlying conductive or semiconductive layer. This layer can be a metal such as Al, Ti, Cu, Mo or alloys thereof, a metal nitride such as titanium nitride, doped or undoped polycrystalline or single crystal silicon, a metal silicide such as titanium silicide, tungsten silicide, cobalt silicide, molybdenum silicide, etc. In the case where oxygen is added to the etching gas mixture, the underlying conductive material preferably excludes materials which are attached by oxygen such as silicon nitride.

The invention is now described with reference to the following examples which illustrate various aspects of the invention. The following tables set forth data relating to processing 6 or 8 inch silicon wafers in a parallel plate plasma reactor. The data includes power (in watts) and temperature (in ° C.) for the top and bottom electrodes, the flow rates (in sccm) for the various gases, chamber pressure (in mTorr), He wafer back cooling pressure (in Torr), gap between top and bottom electrodes (in cm), and CD measurements obtained using a Hitachi S7280 CD-SEM. As shown in the following results, etching with nitrogen rather than CO provided a better etch rate and surprisingly achieved deep and narrow openings whereas use of CO produced a low etch rate and resulted in etch stop.

Figure 2A:
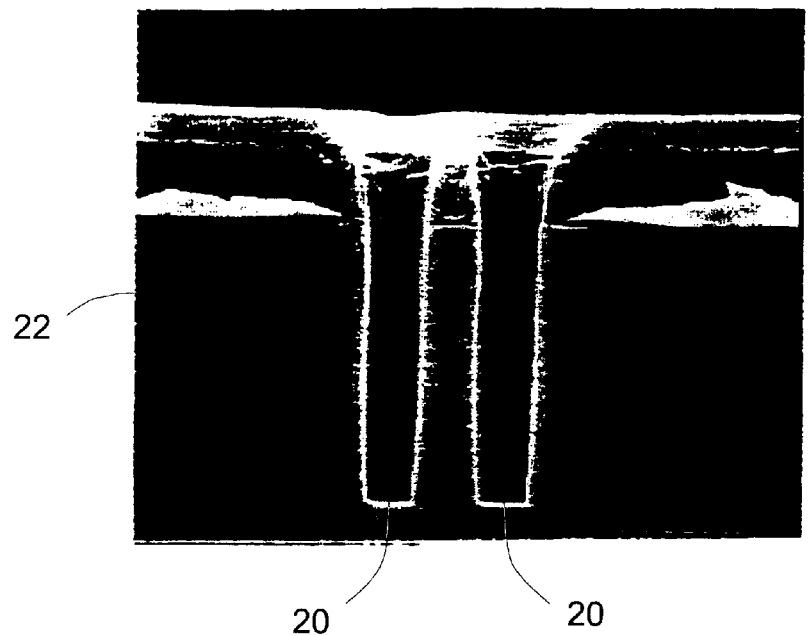
FIGS. 2a and b show profiles of contact openings formed in silicon dioxide at center and edge locations, respectively, on a silicon wafer during a repeatability study in which 25 wafers were processed in a marathon run using a plasma gas chemistry in accordance with the invention.
Figure 2B:
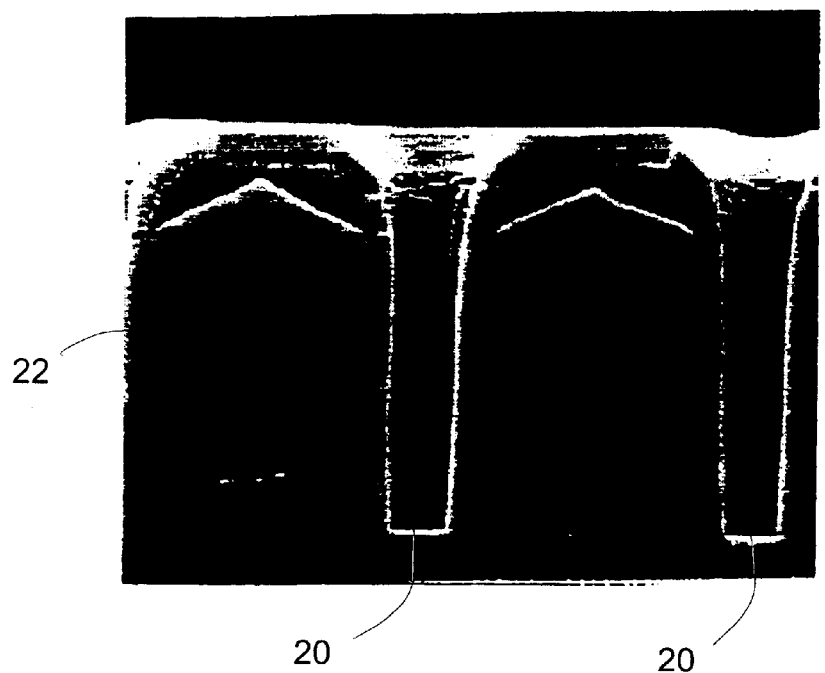
Figure 3:
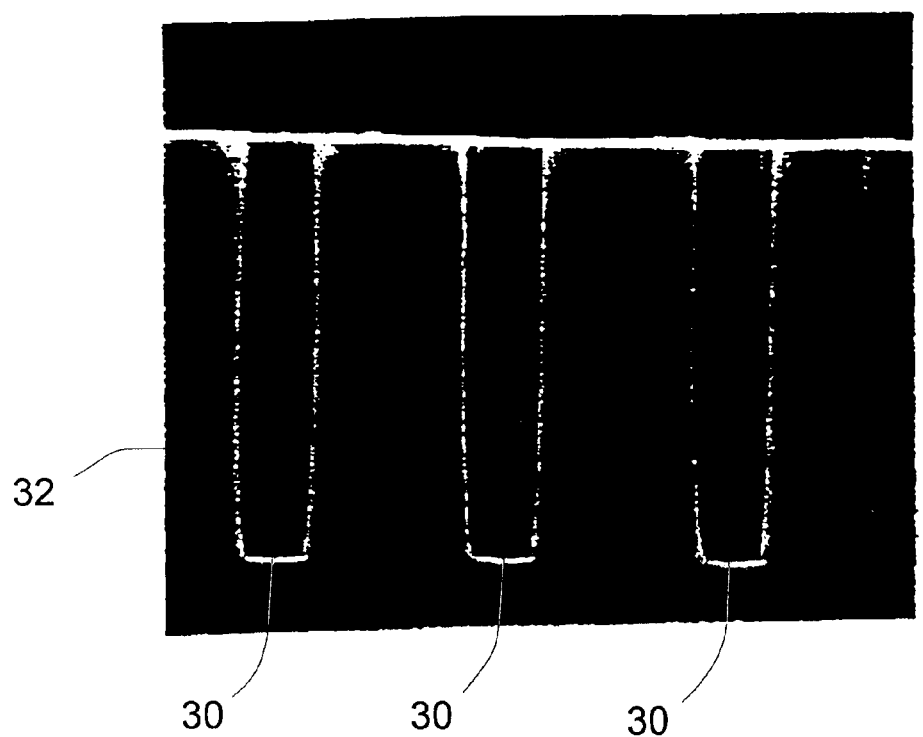
FIG. 3 shows profiles of contact openings formed in silicon dioxide at the center of a silicon wafer using a preferred gas chemistry in accordance with the invention.

Table 1 sets forth data on a 200 mm wafer processed on a LAM 4520XL single wafer plasma etching reactor. In the test, 0.25 $\mu$m patterned oxide wafers were etched for 150 seconds except for the last wafer which was etched for 270 seconds to provide 50% overetch. FIGS. 1*a* and *b* show anisotropically etched openings 10 at the center and edge of the wafer 12 using 2000 watts bottom electrode power, 1000 watts top electrode power, 150 sccm Ar, 6.5 sccm $C_4F_8$, 6 sccm $O_2$, 20 sccm $N_2$, 1.3 cm gap, 15° C. bottom electrode temperature, and 20° C. top electrode. Table 2 sets forth the distribution of tests during a repeatability test and Table 3 sets forth data obtained in a 25 wafer marathon run during the repeatability test. FIGS. 2*a* and *b* show etch profiles 20 at the center and edge of the third wafer 22 during the marathon run. It was established that the uniformity from center to edge of the wafer was acceptable for quarter micron contacts using the fluorocarbon, oxygen, nitrogen and argon gas chemistry in accordance with the invention. FIG. 3 shows profiles of contact openings 30 formed in silicon dioxide 32 at the center of silicon wafer using a preferred gas chemistry in accordance with the invention.

TABLE 1

| comment | wafer Id | con size | E ER | C ER | E sel PR | C sel PR | E Prof | C Prof | Lag E | Lag C |
|---|---|---|---|---|---|---|---|---|---|---|
| | wafer ID | um | edge a/min | center | edge | center | degre | degre | | |
| 2000b/1000t/20N$_2$/8C$_4$F$_8$/7O$_2$/160Ar | ma0dsxg | 0.50 | | 5920 | | 3.43 | | | 0.00 | 0.00 |
| 150" | ma0dsxg | 0.35 | 5920 | 5920 | 3.43 | 3.43 | | | | 0.00 |
| | ma0dsxg | 0.30 | 5920 | 5920 | 3.59 | 3.43 | | | | 0.00 |
| 2000b/1000t/20N$_2$/5C$_4$F$_8$/4O$_2$/160Ar | m10dtng | 0.50 | 5920 | 5760 | 4.20 | 4.09 | | | 0.00 | 0.00 |
| 150" | m10dtng | 0.35 | 5120 | 5120 | 3.64 | 3.27 | | | 13.0 | 11.0 |
| | m10dtng | 0.30 | 5120 | 5120 | 3.27 | 3.64 | | | 14.0 | 11.0 |
| 2000b/1000t/30N$_2$/8C$_4$F$_8$/6O$_2$/160Ar | my0du8g | 0.50 | 6240 | 5920 | 3.98 | 4.74 | | | | |
| 150" | my0du8g | 0.35 | 5920 | 5920 | 3.43 | 3.78 | | | 5.1 | 0.00 |
| | my0du8g | 0.30 | 5280 | 5600 | 3.06 | 3.24 | | | 15.3 | 5.4 |
| 2000b/1000t/50N$_2$/8C$_4$F$_8$/7O$_2$/160Ar | mtodwcg | 0.50 | 6240 | 6400 | 3.31 | 3.39 | | | | |
| 150" | mtodwcg | 0.35 | 5600 | 5600 | 2.97 | 2.97 | | | 10.2 | 12.5 |
| | mtodwcg | 0.30 | 6080 | 6080 | 2.97 | 3.22 | | | 2.5 | 5.0 |
| 2000b/1000t/50N$_2$/8C$_4$F$_8$/7O$_2$/160Ar | m50dvig | 0.50 | 6080 | 6240 | 3.52 | 3.98 | | | | |
| 150" | m50dvig | 0.35 | 5760 | 5440 | 3.67 | 3.15 | | | 5.2 | 12.8 |
| | m50dvig | 0.30 | 5920 | 5760 | 3.43 | 3.67 | | | 2.6 | 7.6 |
| 2000b/1000t/50N$_2$/8C$_4$F$_8$/7O$_2$/160Ar | m00sgfi | 0.50 | 6240 | 6080 | 4.43 | 4.32 | | | | |
| 150" | m00sgfi | 0.35 | 6080 | 5920 | 4.32 | 4.20 | | | 2.5 | 2.6 |
| | m00sgfi | 0.30 | 5920 | 5760 | 3.78 | 3.33 | | | 5.1 | 5.2 |
| 2000b/1000t/50N$_2$/8C$_4$F$_8$/7O$_2$/160Ar | m40dvjg | 0.50 | 4800 | 4800 | 3.41 | 3.41 | | | | |
| 150" | m40dvjg | 0.35 | 4320 | 4160 | 2.50 | 2.95 | | | 10.0 | 13.3 |
| | m40dvjg | 0.30 | 4320 | 0 | 2.76 | 0.00 | | | 10.0 | 0.00 |
| 2000b/1000t/20N$_2$/6.5C$_4$F$_8$/6O$_2$/160Ar | ms0sgni | 0.50 | 6800 | 6400 | 3.86 | 3.64 | | | | |
| 150" | ms0sgni | 0.35 | 6000 | 6200 | 3.41 | 4.56 | | | 11.7 | 3.1 |
| | ms0sgni | 0.30 | 6200 | 6000 | 3.52 | 3.41 | | | 8.8 | 6.2 |
| 2000b/1000t/20N$_2$/6.5C$_4$F$_8$/6O$_2$/160Ar | m91pkx2 | 0.25 | 0 | 0 | 0.00 | 0.00 | 89.5 | 89.0 | | |
| Top Electrode Temperature 20° C. | | | | | | | | | | |
| Bottom Electrode Temperature 15° C. | | | | | | | | | | |

TABLE 2

| Wafer # | Test |
|---|---|
| 1 | P/S Open area etch rate |
| 2 | IBM III wafer partial etch SEM etch rate test |
| 3 | Digital wafer profile repeatability test |
| 4–23 | Resist dummy wafers |

TABLE 2-continued

| Wafer # | Test |
|---|---|
| 24 | Digital wafer profile repeatability test |
| 25 | IBM III wafer partial etch SEM etch rate test |

TABLE 3

| comment | wafer Id | contact size | Edge ER | Center ER | Edge sel PR | Center sel PR | Edge Prof | Center Prof | Lag Edge | Lag Center |
|---|---|---|---|---|---|---|---|---|---|---|
| | marathon | | | | | | | | | |
| 2000b/1000t/20N₂/6.5C₄F₈/6O₂/150Ar | run 1 open | | 6500 | | | | 88.6 | 88.7 | | |
| 2000b/1000t/20N₂/6.5C₄F₈/6O₂/150Ar | run 2 | 0.50 | 6400 | 6400 | 4.55 | 4.55 | | | | |
| 150″ | run 2 | 0.35 | 5600 | 5600 | 3.57 | 3.98 | | | 12.5 | 12.5 |
| | run 2 | 0.30 | 5600 | 5760 | 3.57 | 4.62 | | | 12.5 | 10.0 |
| 2000b/1000t/20N₂/6.5C₄F₈/6O₂/150Ar | dec run 3 | 0.25 | | | | | 88.7 | 88.7 | | |
| 2000b/1000t/20N₂/6.5C₄F₈/6O₂/150Ar | dec run 24 | 0.25 | | | | | 88.6 | 88.7 | | |
| 2000b/1000t/20N₂/6.5C₄F₈/6O₂/150Ar | run 25 | 0.50 | 6400 | 6240 | 4.55 | 3.98 | | | | |
| 150″ | run 25 | 0.35 | 5760 | 5760 | 3.67 | 3.67 | | | 10.0 | 7.6 |
| | run 25 | 0.30 | 5920 | 5920 | 3.78 | 3.78 | | | 7.5 | 5.1 |

Top Electrode Temperature 20° C.
Bottom Electrode Temperature 15° C.
Uniformity on the open area etch rate for run 1 is 3% 1 σ.

In the following tables, open area etch rate, in-contact etch rate, photoresist selectivity, and oxide uniformity were examined using Process Specialty wafers and IBM III wafers. Further, gas flows were evaluated in order to determine the effects on bowing of contacts produced by the process. Table 4 sets forth the fixed conditions and Table 5 sets forth the changes in flow rates of the various gases. The process recipe that gave the best results was 2200 watts bottom electrode, 1200 watts top electrode, 150 sccm Ar, 6.5 sccm $C_4F_8$, 6 sccm $O_2$, 20 sccm $N_2$, 1.3 cm gap, 15° C. bottom electrode and 20° C. top electrode. A full process recipe is set forth in Table 6.

TABLE 4

| | |
|---|---|
| Ar | 160 sccm |
| Vat Value | Open |
| Bottom Power | 2200 w |
| Top Power | 1200 w |
| Bottom Electrode Temperature | 15° C. |
| Top Electrode Temperature | 20° C. |
| Gap | 1.3 cm |
| Confinement rings | 2 |
| Etch Time for IBM III Wafers | 130 sec |
| Etch Time for P/S Wafers | 60 sec |

TABLE 5

| Run | $C_4F_8$ Flow (sccm) | $O_2$ Flow (sccm) | $N_2$ Flow (sccm) |
|---|---|---|---|
| 1 | 7.5 | 8.0 | 31.5 |
| 2 | 6.5 | 6.0 | 13.0 |
| 3 | 8.5 | 6.0 | 13.0 |
| 4 | 6.5 | 10.0 | 13.0 |
| 5 | 8.5 | 10.0 | 13.0 |
| 6 | 6.5 | 6.0 | 50.0 |
| 7 | 8.5 | 6.0 | 50.0 |
| 8 | 6.5 | 10.0 | 50.0 |
| 9 | 8.5 | 10.0 | 50.0 |
| 10 | 5.81821 | 8.0 | 31.5 |
| 11 | 9.18179 | 8.0 | 31.5 |
| 12 | 7.5 | 4.63641 | 31.5 |
| 13 | 7.5 | 11.3636 | 31.5 |
| 14 | 7.5 | 8.0 | 0.386833 |
| 15 | 7.5 | 8.0 | 62.6132 |
| 16 | 7.5 | 8.0 | 31.5 |

TABLE 6

| Step | 1 | 2 | 3 | 4 | 5 | 6 | 7 | 8 |
|---|---|---|---|---|---|---|---|---|
| Pressure (mT) | 0 | 0 | 0 | 0 | 0 | 200 | 200 | 200 |
| ESC Power (V) | 2000 | 700 | 700 | 700 | 700 | −2000 | 0 | 0 |
| Power top (W) | — | | 0 | 700 | 1200 | | | |
| Power bot (W) | — | | 500 | 1200 | 2200 | 0 | | |
| Gap (cm) | 1.3 | 1.3 | 1.3 | 1.3 | 1.3 | 7.33 | 7.33 | 7.33 |
| Ar (sccm) | 300 | 300 | 300 | 300 | 300 | 450 | 450 | 450 |
| $C_4F_8$ (sccm) | 6.5 | 6.5 | 6.5 | 6.5 | 6.5 | | | |
| $N_2$ (sccm) | 20 | 20 | 20 | 20 | 20 | | | |

TABLE 6-continued

| Step | 1 | 2 | 3 | 4 | 5 | 6 | 7 | 8 |
|---|---|---|---|---|---|---|---|---|
| $O_2$ (sccm) | 6 | 6 | 6 | 6 | 6 | | | |
| He clamp (torr) | — | 15 | 15 | 15 | 15 | 3 | 3 | 3 |
| Completion | Time 15 | Stabl 30 | Time 3 | Time 3 | Time * | Time 5 | Stable 10 | Time 5 |
| Lifter Position | Down | Down | Down | Down | Down | Down | Down | Down |

Top Electrode Temperature = 20° C.
Bottom Electrode Temperature = 15° C.
*Four pin lifter position is raised in the last steps to decrease ESC wafer sticking possibility and aid wafer transport reliability.
Step 4 is used for etching through the BARC layer on the wafer.

Photoresist selectivity and in-contact etch rate are set forth in Tables 7–9 wherein Table 7 shows results for 0.5 micron contacts, Table 8 shows results for 0.35 micron contacts and Table 9 shows results for 0.3 micron contacts.

TABLE 7

| Gas Flow | Edge ER | Center ER | Edge Sel | Cent Sel |
|---|---|---|---|---|
| $7.5C_4F_8/8O_2/31.5N_2$ | 7200.0 | 6830.8 | 5.7 | 5.4 |
| $6.5C_4F_8/6O_2/13N_2$ | 6276.9 | 4615.4 | 5.9 | 5.2 |
| $8.5C_4F_8/6O_2/13N_2$ | 2953.8 | 2215.4 | 2.8 | 2.5 |
| $6.5C_4F_8/10O_2/13N_2$ | 5538.5 | 5538.5 | 3.4 | 3.1 |
| $6.5C_4F_8/10O_2/13N_2$ | 6276.9 | 7384.6 | 4.4 | 4.5 |
| $6.5C_4F_8/6O_2/50N_2$ | 6461.5 | 6276.9 | 4.5 | 5.0 |
| $8.5C_4F_8/6O_2/50N_2$ | 6830.8 | 6276.9 | 4.7 | 5.0 |
| $6.5C_4F_8/10O_2/50N_2$ | 4430.8 | 4246.2 | 3.5 | 2.9 |
| $8.5C_4F_8/10O_2/50N_2$ | 6646.2 | 6646.2 | 3.1 | 3.1 |
| $5.8C_4F_8/8O_2/31.5N_2$ | 4984.6 | 4800.0 | 3.1 | 3.0 |
| $9.1C_4F_8/8O_2/31.5N_2$ | 7384.6 | 7753.8 | 5.9 | 7.2 |
| $7.5C_4F_8/4.6O_2/31.5N_2$ | 4800.0 | 4246.2 | 4.5 | 4.8 |
| $7.5C_4F_8/11.3O_2/31.5N_2$ | 5169.2 | 5353.8 | 3.2 | 3.3 |
| $7.5C_4F_8/8O_2/0N_2$ | 3876.9 | 2769.2 | 3.6 | 3.1 |
| $7.5C_4F_8/8O_2/62N_2$ | 5907.7 | 5723.1 | 4.7 | 4.6 |
| $7.5C_4F_8/8O_2/31.5N_2$ | 6830.8 | 6461.5 | 4.2 | 4.5 |

TABLE 8

| Gas Flow | Edge ER | Center ER | Edge Sel | Cent Sel | Edge lag | Cent lag |
|---|---|---|---|---|---|---|
| $7.5C_4F_8/8O_2/31.5N_2$ | 6092.3 | 6092.3 | 4.2 | 4.9 | 15.4 | 10.8 |
| $6.5C_4F_8/6O_2/13N_2$ | 6276.9 | 4984.6 | 5.9 | 5.6 | 0.0 | -8.0 |
| $8.5C_4F_8/6O_2/13N_2$ | 2584.6 | 1661.5 | 2.4 | 1.3 | 12.5 | 25.0 |
| $6.5C_4F_8/10O_2/13N_2$ | 4800.0 | 4984.6 | 3.0 | 3.1 | 13.3 | 10.0 |
| $6.5C_4F_8/10O_2/13N_2$ | 6461.5 | 6830.8 | 4.5 | 4.7 | -2.9 | 7.5 |
| $6.5C_4F_8/6O_2/50N_2$ | 5538.5 | 5538.5 | 4.4 | 4.4 | 14.3 | 11.8 |
| $8.5C_4F_8/6O_2/50N_2$ | 6461.5 | 6092.3 | 4.0 | 4.2 | 5.4 | 2.9 |
| $6.5C_4F_8/10O_2/50N_2$ | 3692.3 | 3692.3 | 2.6 | 2.6 | 16.7 | 13.0 |
| $8.5C_4F_8/10O_2/50N_2$ | 5907.7 | 5723.1 | 2.7 | 2.6 | 11.1 | 13.9 |
| $5.8C_4F_8/8O_2/31.5N_2$ | 4430.8 | 4246.2 | 2.7 | 2.6 | 11.1 | 11.5 |
| $9.1C_4F_8/8O_2/31.5N_2$ | 7015.4 | 7200.0 | 4.9 | 5.7 | 5.0 | 7.1 |
| $7.5C_4F_8/4.6O_2/31.5N_2$ | 4430.8 | 4061.5 | 4.1 | 3.8 | 7.7 | 4.3 |
| $7.5C_4F_8/11.3O_2/31.5N_2$ | 4800.0 | 4800.0 | 3.0 | 3.3 | 7.1 | 10.3 |
| $7.5C_4F_8/8O_2/0N_2$ | 3323.1 | 2030.8 | 3.8 | 2.3 | 14.3 | 26.7 |
| $7.5C_4F_8/8O_2/62N_2$ | 5353.8 | 4984.6 | 4.3 | 4.0 | 9.4 | 12.9 |
| $7.5C_4F_8/8O_2/31.5N_2$ | 6092.3 | 5538.5 | 4.2 | 4.4 | 10.8 | 14.3 |

TABLE 9

| Gas Flow | Edge ER | Center ER | Edge Sel | Cent Sel | Edge lag | Cent lag |
|---|---|---|---|---|---|---|
| $7.5C_4F_8/8O_2/31.5N_2$ | 6461.5 | 6461.5 | 4.5 | 4.5 | 10.3 | 5.4 |
| $6.5C_4F_8/6O_2/13N_2$ | 5907.7 | 4800.0 | 4.7 | 3.8 | 5.9 | -4.0 |
| $8.5C_4F_8/6O_2/13N_2$ | 2215.4 | 1661.5 | 1.8 | 1.9 | 25.0 | 25.0 |
| $6.5C_4F_8/10O_2/13N_2$ | 4800.0 | 5538.5 | 3.0 | 3.4 | 13.3 | 0.0 |

TABLE 9-continued

| Gas Flow | Edge ER | Center ER | Edge Sel | Cent Sel | Edge lag | Cent lag |
|---|---|---|---|---|---|---|
| $6.5C_4F_8/10O_2/13N_2$ | 6646.2 | 7015.4 | 4.6 | 3.9 | -5.9 | 5.0 |
| $6.5C_4F_8/6O_2/50N_2$ | 5907.7 | 5538.5 | 4.7 | 4.4 | 8.6 | 11.8 |
| $8.5C_4F_8/6O_2/50N_2$ | 6092.3 | 5723.1 | 4.2 | 4.6 | 10.8 | 8.8 |
| $6.5C_4F_8/10O_2/50N_2$ | 3876.9 | 3876.9 | 2.7 | 3.1 | 12.5 | 8.7 |
| $8.5C_4F_8/10O_2/50N_2$ | 6461.5 | 6092.3 | 3.0 | 3.1 | 2.8 | 8.3 |
| $5.8C_4F_8/8O_2/31.5N_2$ | 4800.0 | 4615.4 | 2.7 | 2.6 | 3.7 | 3.8 |
| $9.1C_4F_8/8O_2/31.5N_2$ | 6830.8 | 7200.0 | 5.4 | 5.7 | 7.5 | 7.1 |
| $7.5C_4F_8/4.6O_2/31.5N_2$ | 4061.5 | 3323.1 | 3.8 | 3.1 | 15.4 | 21.7 |
| $7.5C_4F_8/11.3O_2/31.5N_2$ | 4615.4 | 4984.6 | 2.8 | 3.1 | 10.7 | 6.9 |
| $7.5C_4F_8/8O_2/0N_2$ | 3138.5 | 1292.3 | 2.9 | 1.5 | 19.0 | 53.3 |
| $7.5C_4F_8/8O_2/62N_2$ | 5353.8 | 5353.8 | 3.3 | 3.7 | 9.4 | 6.5 |
| $7.5C_4F_8/8O_2/31.5N_2$ | 6461.5 | 5353.8 | 4.5 | 3.7 | 5.4 | 17.1 |

Results of open area etching on etch rate and uniformity are set forth in Table 10. The open area etch indicates that the most significant factors affecting the etch rate are the $C_8F_8$ flow and the interaction of $C_4F_8$ and $O_2$ gas. Increase in $C_4F_8$ flow increases the etch rate. The interaction of $C_4F_8$ and $O_2$ shows that the increase in $C_4F_8$ and $O_2$ speeds up etch rate. This trend is different from the $0.3\mu$ etch rate trend. Since contact blow out is not a consideration in the open area etch rate, the trends are different from small contact etch rate. The uniformity for the most polymerizing conditions was high and the flow of $C_4F_8$ showed the highest effect on the uniformity.

TABLE 10

| run | Uniformity 3 s % | Etch rate A/min |
|---|---|---|
| 1 | 7.2 | 6808 |
| 2 | 7.5 | 6779 |
| 3 | 40.1 | 6253 |
| 4 | 8.4 | 6126 |
| 5 | 5.6 | 7385 |
| 6 | 8.7 | 6541 |
| 7 | 6.4 | 7335 |
| 8 | 11.5 | 5020 |
| 9 | 8.1 | 7123 |
| 10 | 65.5 | 5405 |
| 11 | 7.3 | 7510 |
| 12 | 6.7 | 7018 |
| 13 | 11.3 | 6351 |
| 14 | 33.5 | 7190 |
| 15 | 8.9 | 6794 |
| 16 | 7.6 | 7060 |

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A process for etching a layer of silicon oxide, comprising the steps of:
    introducing a semiconductor substrate into a plasma etching reactor, the semiconductor substrate comprising an electrically conductive or semiconductive layer underlying a layer of silicon oxide; and
    etching the layer of silicon oxide to expose the electrically conductive or semiconductive layer and provide openings having a size smaller than 0.3 μm and an aspect ratio of at least 5:1, the openings extending through the layer of silicon oxide to the electrical conductive or semiconductive layer, the etching being performed by exposing the layer of silicon oxide to a hydrogen-free etching gas in an ionized state in the plasma etching reactor, the etching gas including fluorocarbon, nitrogen and oxygen reactants and an inert carrier gas, the oxygen and nitrogen being present in amounts effective to prevent polymer build-up from causing etch stop in the openings during the etching step.

2. The process of claim 1, wherein the layer of silicon oxide comprises doped or undoped silicon dioxide.

3. The process of claim 1, wherein the etching step is carried out in a medium density plasma reactor.

4. The process of claim 1, wherein the openings are etched without bowing while providing the openings with an aspect ratio of at most 6:1.

5. The process of claim 1, wherein the etching gas consists essentially of $C_4F_8$, argon, nitrogen and oxygen.

6. The process of claim 1, wherein the electrically conductive or semiconductive layer comprises a metal-containing layer selected from the group consisting of doped and undoped polycrystalline or single crystal silicon, aluminum, copper, titanium, tungsten, molybdenum or alloys thereof, titanium nitride, titanium silicide, tungsten silicide, cobalt silicide, and molybdenum silicide.

7. The process of claim 1, wherein the openings are 0.25 micron or smaller sized openings.

8. The process of claim 1, wherein the carrier gas is selected from the group consisting of Ar, He, Ne, Kr, Xe or mixtures thereof.

9. The process of claim 1, wherein the oxygen is supplied to the plasma reactor at a flow rate of 3 to 15 sccm.

10. The process of claim 1, wherein the nitrogen is supplied to the plasma reactor at a flow rate of 1 to 100 sccm.

11. The process of claim 1, wherein the fluorocarbon gas is supplied to the plasma reactor at a flow rate of 3 to 15 sccm.

12. The process of claim 1, wherein the fluorocarbon, oxygen and nitrogen gases are supplied to the plasma reactor at flow rates of 5 to 10 sccm, 5 to 10 sccm and 20 to 60 sccm, respectively.

13. The process of claim 1, wherein the etching step is carried out until up to 200% overetching is achieved.

14. The process of claim 1, further comprising steps of forming a photoresist layer on the layer of silicon oxide, patterning the photoresist layer to form a plurality of openings and the etching step forms via or contact openings in the silicon oxide.

15. The process of claim 1, wherein the openings are formed with an aspect ratio of at least 5:1.

16. The process of claim 1, wherein the plasma reactor is at a pressure of less than 200 mTorr during the etching step.

17. The process of claim 1, wherein the semiconductor substrate comprises a silicon wafer and the wafer is maintained at a temperature of no greater than 130° C. during the etching step.

18. A process for etching a layer of silicon oxide comprising the steps of:
    introducing a semiconductor substrate into a plasma etching reactor, the semiconductor substrate comprising an electrically conductive or semiconductive layer underlying a layer of silicon oxide;
    etching the layer of silicon oxide to expose the electrically conductive or semiconductive layer and provide openings having a size of smaller than 0.3 μm and an aspect ratio of at least 5:1, the openings extending through the layer of silicon oxide to the electrical conductive or semiconductive layer, the etching being performed by exposing the layer of silicon oxide to a hydrogen-free etching gas in an ionized state in the plasma etching reactor, the etching gas including fluorocarbon, nitrogen and oxygen reactants and an inert carrier gas, the oxygen and nitrogen being present in amounts effective to prevent polymer build-up from causing etch stop in the openings during the etching step, the oxygen in the etching gas reacting with polymer deposited in the openings and forming CO and the nitrogen in the etching as reacting with polymer deposited in the openings and forming CN during the etching step; and
    filling the openings with metal after the etching step.

19. A process for etching a layer of silicon oxide comprising the steps of:
    introducing a semiconductor substrate into a plasma etching reactor, the semiconductor substrate comprising an electrically conductive or semiconductive layer underlying a layer of silicon oxide; and
    etching the layer of silicon oxide to expose the electrically conductive or semiconductive layer and provide 0.25 μm or smaller openings having an aspect ratio of at least 5:1 and extending through the layer of silicon oxide to the electrical conductive or semiconductive layer, the etching being performed by exposing the layer of silicon oxide to a hydrogen-free etching gas in an ionized state in the plasma etching reactor, the etching gas including fluorocarbon, nitrogen and oxygen reactants and an inert carrier gas, the oxygen and nitrogen being present in amounts effective to prevent polymer build-up from causing etch stop in the openings during the etching step;
    wherein the oxygen in the etching gas reacts with polymer deposited in the openings and forms CO and the nitrogen in the etching gas reacts with polymer deposited in the openings and forms CN during the etching step.

* * * * *